(12) United States Patent
Liao et al.

(10) Patent No.: US 10,770,636 B2
(45) Date of Patent: Sep. 8, 2020

(54) LIGHT EMITTING DEVICE AND MANUFACTURING METHOD THEREOF

(71) Applicant: EPISTAR CORPORATION, Hsinchu (TW)

(72) Inventors: Shih-An Liao, Hsinchu (TW); Ming-Chi Hsu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/274,666

(22) Filed: Feb. 13, 2019

(65) Prior Publication Data

US 2019/0252586 A1    Aug. 15, 2019

(30) Foreign Application Priority Data

Feb. 14, 2018 (CN) .......................... 2018 1 0151867
Nov. 12, 2018 (TW) .............................. 107140086 A

(51) Int. Cl.
*H01L 33/62* (2010.01)
*H01L 33/60* (2010.01)
*H01L 25/16* (2006.01)
*H01L 33/50* (2010.01)
*H01L 33/48* (2010.01)
*H01L 33/52* (2010.01)

(52) U.S. Cl.
CPC ............ *H01L 33/62* (2013.01); *H01L 25/167* (2013.01); *H01L 33/486* (2013.01); *H01L 33/50* (2013.01); *H01L 33/60* (2013.01); *H01L 33/52* (2013.01); *H01L 2933/005* (2013.01); *H01L 2933/0033* (2013.01); *H01L 2933/0066* (2013.01); *H01L 2933/0091* (2013.01)

(58) Field of Classification Search
CPC ....... H01L 33/62; H01L 33/486; H01L 33/60; H01L 25/167; H01L 33/50; H01L 33/52; H01L 2933/0091; H01L 2933/005; H01L 2933/0066; H01L 2933/0033
See application file for complete search history.

(56) References Cited

U.S. PATENT DOCUMENTS

| 8,049,237 B2 | 11/2011 | Yamada et al. |
| 8,999,736 B2 | 4/2015 | Hsieh et al. |
| 2005/0121686 A1* | 6/2005 | Keller .................. H01L 25/167 257/99 |
| 2013/0099276 A1 | 4/2013 | Fukushima et al. |
| 2014/0239320 A1 | 8/2014 | Miyoshi et al. |
| 2015/0060912 A1* | 3/2015 | Lin ....................... H01L 25/167 257/98 |
| 2015/0221835 A1 | 8/2015 | Tischler et al. |
| 2017/0194540 A1 | 7/2017 | Liu et al. |

\* cited by examiner

*Primary Examiner* — Karen Kusumakar
(74) *Attorney, Agent, or Firm* — Patterson + Sheridan, LLP

(57) ABSTRACT

The invention discloses a light-emitting device and a manufacturing method thereof. The light-emitting device comprising: a light-emitting unit, the light-emitting unit comprises a non-light-emitting element and a light-emitting diode; a reflective layer covering the non-light-emitting element; a light-transmitting layer covering the reflective layer and the light-emitting diode; a metal connection layer electrically connecting the non-light-emitting element and the light-emitting diode.

19 Claims, 14 Drawing Sheets

LIGHT EMITTING DEVICE AND MANUFACTURING METHOD THEREOF

CROSS-REFERENCE TO RELATED APPLICATIONS

This application claims the right of priority based on CN Application Serial No. 201810151867.5, filed on Feb. 14, 2018 and the right of priority based on TW Application Serial No. 107140086, filed on Nov. 12, 2018, and the contents of which are hereby incorporated by references in their entireties.

TECHNICAL FIELD

The present disclosure relates to a light-emitting device and manufacturing method thereof. More particularly, the present disclosure relates to a light-emitting device including a voltage-stabilizing diode and a light-emitting diode, and a manufacturing method of the light-emitting device.

DESCRIPTION OF BACKGROUND ART

In order to prevent EOS (Electrical Over Stress) and ESD (Electro-Static discharge) damage to the light-emitting diode (LED), some electronic components with Zener characteristic are usually added to the circuit. The electronic component with Zener characteristic does not affect the operation of the circuit, and can guide the abnormal discharge current to the ground terminal during the transient surge, and protect the circuit and the LED. Commonly used electronic components are Zener Diode, Transient Voltage Suppressor Diode (TVS Diode), or surface mount resistor (Varistor).

As shown in FIG. 1, a common packaging method is to add a Zener diode connected in parallel with the light-emitting diode to protect the light-emitting diode in the LED package. For example, the p-electrode (anode or positive electrode) Za of the Zener diode is electrically connected to the n-electrode (cathode or negative electrode) Bc of the light-emitting diode, and the n-electrode (cathode or negative electrode) Zc of the Zener diode is electrically connected to p-electrode (anode or positive electrode) Ba of the light-emitting diode. The manufacturing method comprises the steps of: placing the light-emitting diode and the Zener diode on a carrier substrate, and electrically connecting the light-emitting diode and the Zener diode by using a wire-bonding method, but this manufacturing method is complicated and the volume of the package structure cannot be reduced.

For the above-mentioned problems in the related art, no effective solution has been proposed yet.

SUMMARY OF THE DISCLOSURE

A light-emitting device comprises a light-emitting unit. The light emitting unit includes a non-light-emitting element and a light-emitting diode. A reflective layer covers the non-light-emitting element. A light-transmitting layer covers the reflective layer and the light-emitting diode. A metal connection layer is electrically connected to the non-light-emitting element and the light-emitting diode.

DETAILED DESCRIPTION OF THE PRESENT DISCLOSURE

The following content provides many different embodiments or examples for implementing different features of the present disclosure. Specific examples of components and arrangements are described below to simplify the present disclosure. These are merely examples and are not intended to limit the present disclosure. For example, in the following description, forming a first component over or above a second component may include an embodiment that the first component and the second component are formed in direct contact, and may also include an embodiment that additional components may be formed between the first component and the second component such that the first component and the second component are not in direct contact.

In addition, for convenience of description, spatially relative terms such as "below", "under", "lower", "upper", "on", and the like may be used herein to describe relationship of one component or element to another (or other) component or element as shown in the figures. Spatially relative terms are intended to comprise different orientations of the apparatus in use or operation in addition to the orientations shown in the figures. The device may be otherwise oriented (rotated 90 degrees or in other orientations) and the spatially relative descriptions used herein may be interpreted accordingly.

Figure 2A:
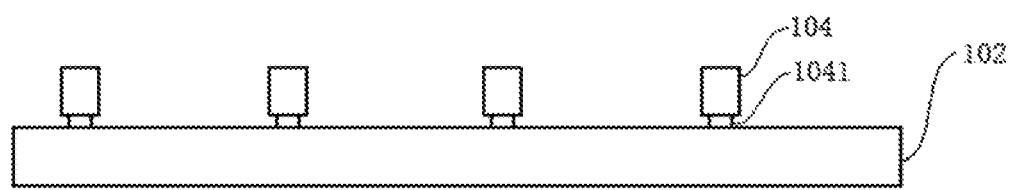
FIGS. 2A to 2J show the cross-sectional views of a manufacturing process of a light-emitting device in accordance with an embodiment of the present disclosure.
Figure 2B:
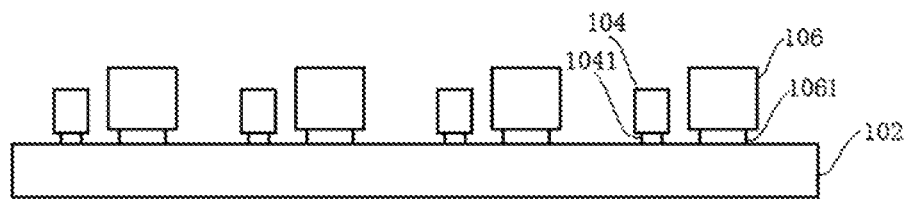

FIGS. 2A to 2J show the schematic diagrams of a manufacturing process of a light-emitting device in accordance with an embodiment of the present disclosure. As shown in FIG. 2A and FIG. 2B, a first temporary carrier 102 is provided; a plurality of light-emitting units are disposed on the first temporary carrier 102, and each of the light-emitting units includes a voltage-stabilizing diode 104 (non-light emitting element) and a light-emitting diode 106 (light-emitting element). The voltage-stabilizing diode 104 has a first electrode 1041 and the light-emitting diode 106 has a second electrode 1061. Referring to FIG. 3A, the voltage-stabilizing diode 104 and the light-emitting diode 106 respectively has two electrodes. Because of the view angle, FIGS. 2A to 2J only show one electrode.

As shown in FIG. 2A, a plurality of voltage-stabilizing diodes 104 may be first disposed on the first temporary carrier 102 and the first electrode 1041 faces the first temporary carrier 102. In some embodiments, the voltage-stabilizing diode 104 may be a Zener diode or a TVS diode. In this embodiment, the voltage-stabilizing diode 104 is a Zener diode.

As shown in FIG. 2B, a plurality of light-emitting diodes 106 are disposed on the first temporary carrier 102 and respectively adjacent to the plurality of voltage-stabilizing diodes 104. The second electrodes 1061 of the plurality of light-emitting diodes 106 face the first temporary carrier 102. In the present embodiment, the number of the light-emitting diodes 106 and the number of the voltage-stabilizing diodes 104 are both four. Furthermore, a light-emitting diode 106 and a voltage-stabilizing diode 104 are regarded as one light-emitting unit. In other embodiments, a light-emitting unit may include two or more light-emitting diodes 106 and one voltage-stabilizing diode 104, may include one light-emitting diode 106 and two or more voltage-stabilizing diodes 104, or may include two or more light-emitting diodes 106 and two or more voltage-stabilizing diodes 104.

Figure 2C:
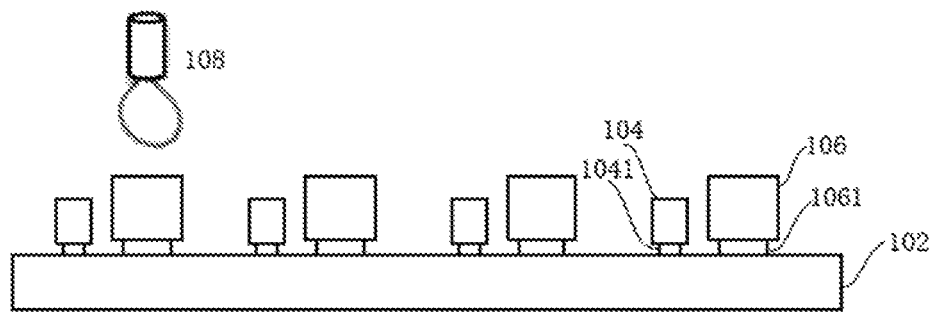
Figure 2D:
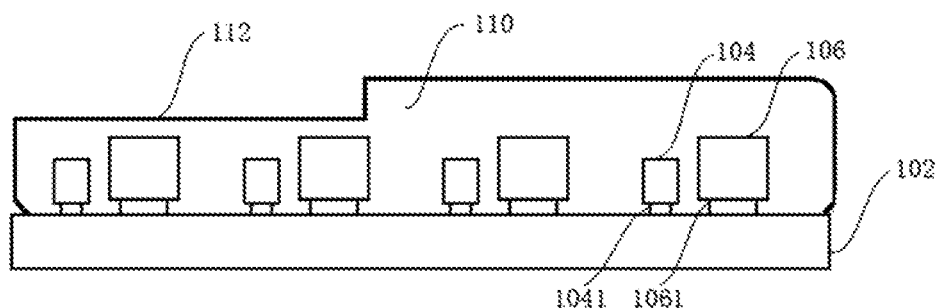
Figure 3A:
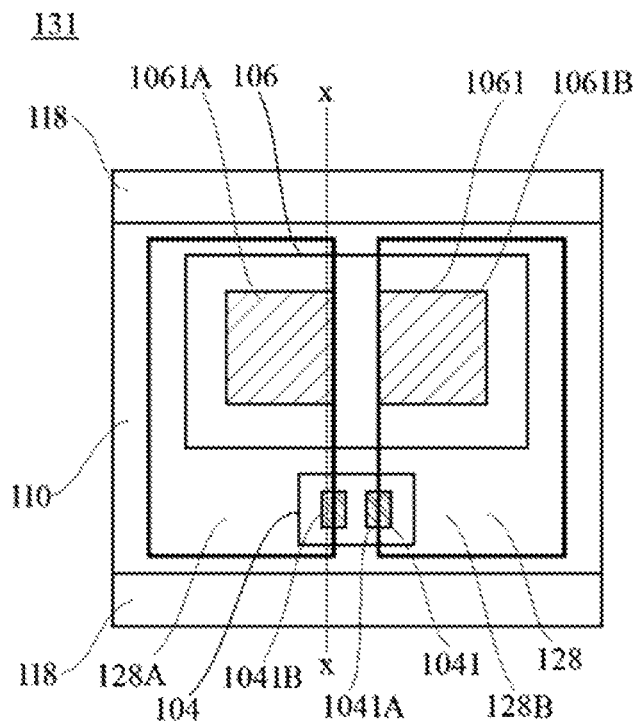
FIG. 3A is a bottom view of a light-emitting device in accordance with an embodiment of the present disclosure.

As shown in FIG. 2C and FIG. 2D, a first insulating layer 110 is formed on the first temporary carrier 102, and the first insulating layer 110 covers the plurality of voltage-stabilizing diodes 104 and the plurality of light-emitting diodes 106. In the present embodiment, the first insulating layer 110 is a light-transmitting layer. Optionally, the phosphor particles are mixed into the light-transmitting layer. The first insulating layer 110 may include silicone or epoxy, and the first insulating layer 110 may be formed by dispensing, spraying, or molding. In the present embodiment, the dispensing 108 method is used as an example.

As shown in FIG. 2D, the light-transmitting layer is physically removed, by grinding or polishing for example, to form a surface 112 that will be bonded with a second temporary carrier 114 in a subsequent manufacturing process.

Figure 2E:
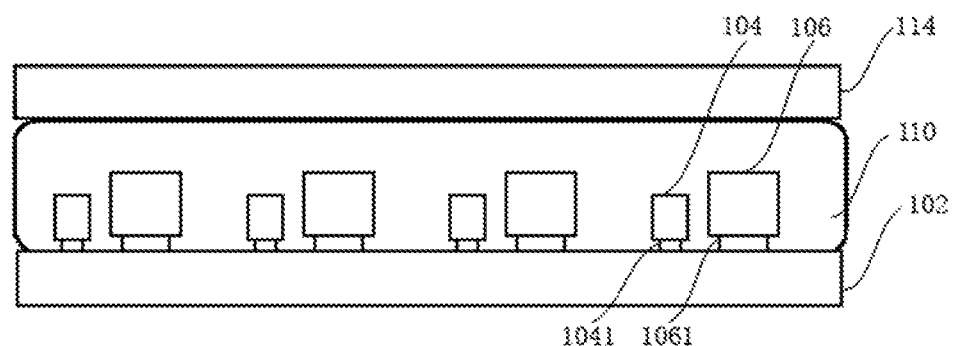

As shown in FIG. 2E, the second temporary carrier 114 is bonded such that the plurality of light-emitting diodes 106 and the plurality of voltage-stabilizing diodes 104 are located between the first temporary carrier 102 and the second temporary carrier 114. That means the second temporary carrier 114 is boned to the surface 112 of the light-transmitting layer.

Figure 2F:
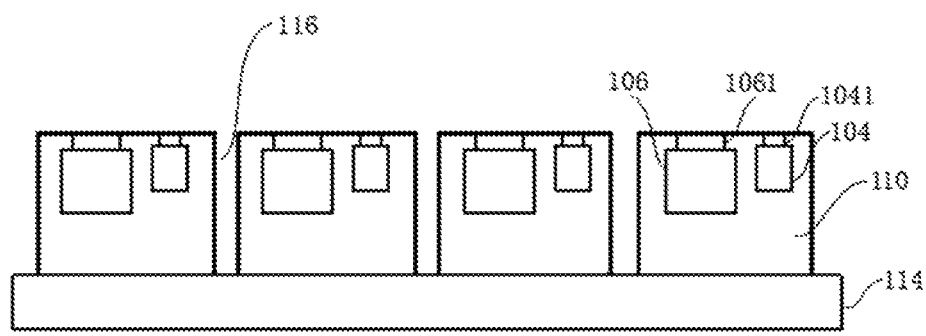

As shown in FIG. 2F, after flipping the structure of FIG. 2E and removing the first temporary carrier 102, a trench 116 is formed between any two adjacent light-emitting units. In other words, the trench 116 is formed between the voltage-stabilizing diode 104 of a light-emitting unit and the light-emitting diode 106 of another adjacent light-emitting unit.

Figure 2G:
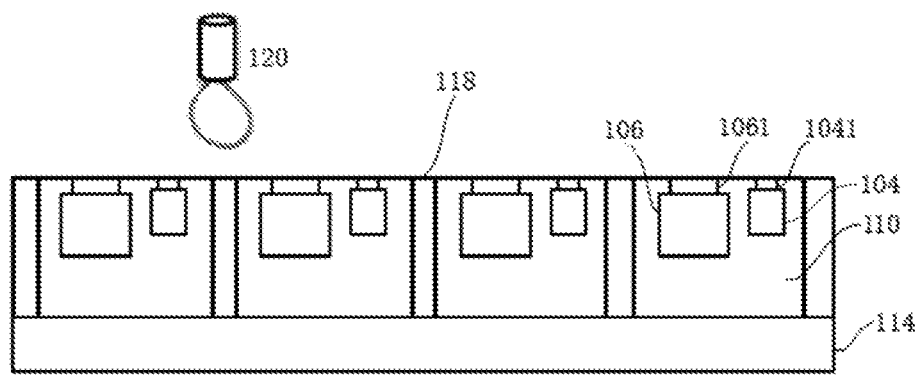

As shown in FIG. 2G, the glue layer 118 is filled in the trenches 116. The glue layer 118 is formed by mixing reflective particles into the base material, and can reflect the light emitted by the light-emitting diode 106, and thus can also be regarded as a reflective layer. The color of the glue layer 118 is depended on the mixed reflective particles, and the common color is white. The base material may be an insulating material and can be silicone-based or epoxy-based; the reflective particles may include titanium dioxide, hafnium oxide, barium sulfate, or aluminum oxide. The glue layer 118 may be formed by dispensing, spraying, printing or molding. In the present embodiment, the dispensing 120 method is used as an example.

Figure 2H:
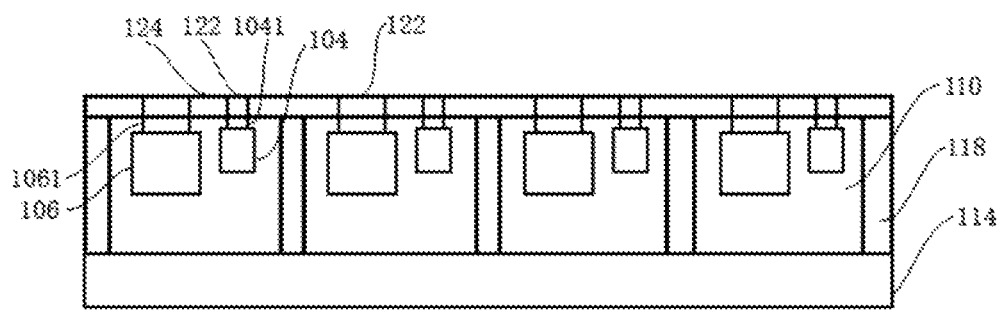
Figure 2I:
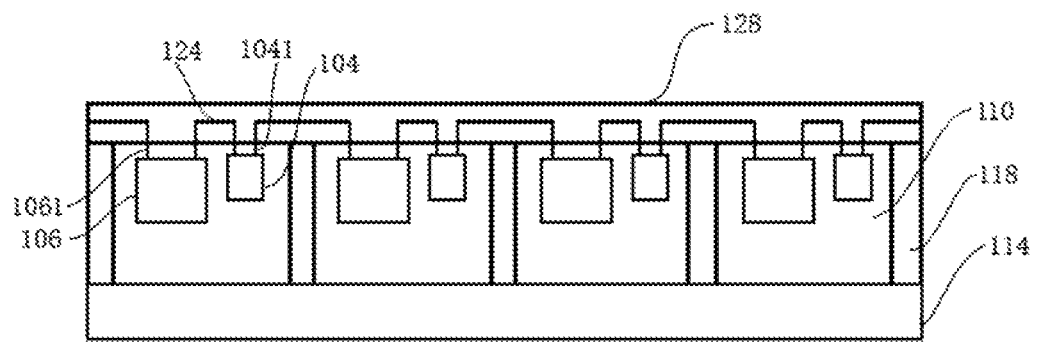

As shown in FIG. 2H and FIG. 2I, a metal connection layer is formed on a side of the plurality of light-emitting units that is away from the second temporary carrier 114. In an embodiment, as shown in FIG. 2H, the protective layers 122 are respectively covered on the first electrode 1041 of each of the voltage-stabilizing diodes 104 and the second electrode 1061 of each of the light emitting diodes 106. A second insulating layer 124 is filled between the protective layers. The second insulating layer 124 may be the above-mentioned glue layer. The protective layer 122 can be a photoresist. In another embodiment, the second insulating layer 124 can be directly formed on the glue layer 118 and the first insulating layer 110 by printing, so that it is not necessary to form the protective layer 122 on the first electrode 1041 and the second electrode 1061 and the process can be simplified. The second insulating layer 124 may also be formed on the first electrode 1041 and the second electrode 1061 in a specifically selected process. For example, the second insulating layer 124 covers the periphery of the first electrode 1041 and the second electrode 1061, but does not cover the middle portion thereof.

As shown in FIG. 2I, after removing the protective layer 122, the first electrode 1041 and the second electrode 1061 are exposed. A metal connection layer 128 is formed on the first electrode 1041, the second electrode 1061 and the second insulating layer 124, wherein the metal connection layer 128 is connected to the first electrode 1041 of each of the voltage-stabilizing diodes 104 and the second electrode 1061 of each of the light-emitting diodes 106, and FIGS. 3A and 3B can be referred for detailed structure. The metal connection layer 128 can be formed by a printing or electroplating process. The material of the metal connection layer 128 comprises titanium, copper, nickel, silver, tin, gold, platinum or a combination thereof.

Figure 2J:
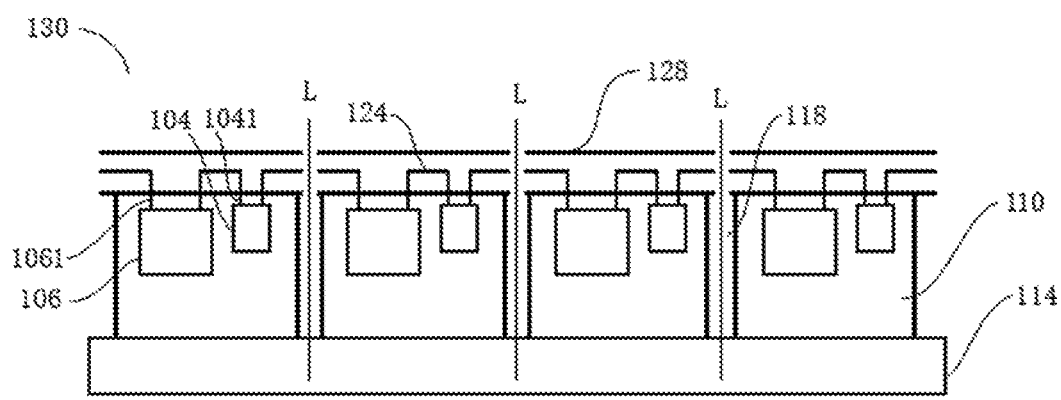

As shown in FIG. 2J, the metal connection layer 128, the second insulation layer 124, and the glue layer 118 are cut, and finally the second temporary carrier 114 is removed to form a plurality of light-emitting devices 130, wherein the cutting for forming the plurality of light-emitting devices 130 is performed according to the position of the glue layer 118, that is, cutting is performed along the straight line L. The light-emitting device 130 includes a light-emitting unit, a first insulating layer 110, a glue layer 118, a second insulating layer 124, and a metal connection layer 128. The voltage-stabilizing diode 104 and the light-emitting diode 106 of each of the light-emitting units are electrically connected to each other. The first insulating layer 110 covers the voltage-stabilizing diode 104 and the light-emitting diode 106.

Figure 3B:
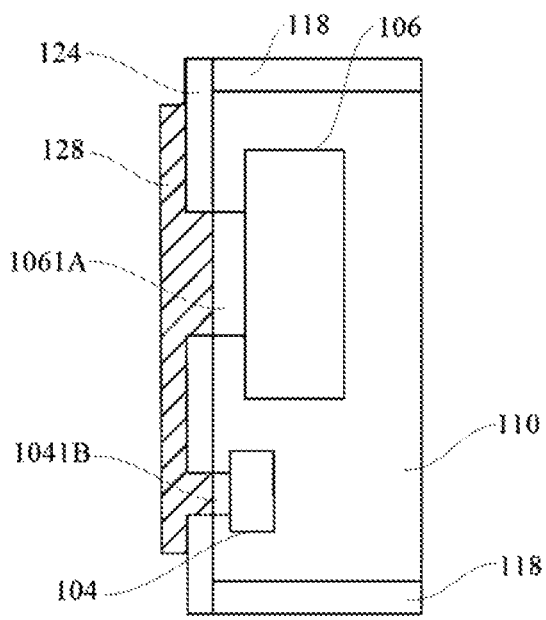
FIG. 3B is a cross-sectional view at X-X in FIG. 3A.

As shown in FIGS. 3A and 3B, a bottom view and a cross-sectional view of a light-emitting device 131 in an embodiment are exemplarily shown. FIG. 3B is a cross-sectional view of the X-X line in FIG. 3A. In order to clearly show the relative relationship between the components, each component is drawn in solid lines. However, in the actual product, only the second insulating layer 124 and the metal connection layer 128 can be viewed from the bottom view of the light-emitting device 131.

Figure 1:
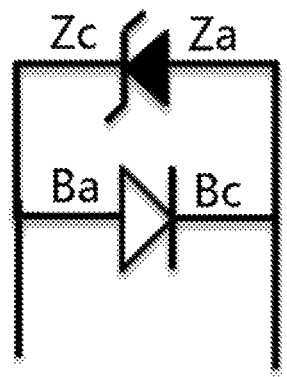
FIG. 1 is a schematic circuit diagram of the connection between the light-emitting diode and the Zener diode.

As shown in FIG. 3A, the light-emitting diode 106 has two second electrodes 1061 (a first sub-second electrode 1061A and a second sub-second electrode 1061B). For example, the first sub-second electrode 1061A is a p-electrode (anode or positive electrode), and the second sub-second electrode 1061B is an n-electrode (cathode or negative electrode). The voltage-stabilizing diode 104 has two first electrodes 1041 (a first sub-first electrode 1041A and a second sub-first electrode 1041B). The first sub-first electrode 1041A is a p-electrode, and the second sub-first electrode 1041B is an n-electrode. The metal connection layer includes a first connection portion 128A and a second connection portion 128B. The first connection portion 128A directly covers and contacts the first sub-second electrode 1061A (p-electrode) of the light-emitting diode 106 and the second sub-first electrode 1041B (n-electrode) of the voltage-stabilizing diode 104 so the first sub-second electrode 1061A (p-electrode) of the light-emitting diode 106 is connected to the second sub-first electrode 1041B (n-electrode) of the voltage-stabilizing diode 104. Similarly, the second connection portion 128B directly covers and contacts the second sub-second electrode 1061B (n-electrode) of the light-emitting diode 106 and the first sub-first electrode 1041A (p-electrode) of the voltage-stabilizing diode 104, whereby the second sub-second electrode 1061B (n-electrode) of the light-emitting diode 106 is connected to the first sub-first electrode 1041A (p-electrode) of the voltage-stabilizing diode 104. Therefore, the light-emitting diode 106 and the voltage-stabilizing diode 104 are connected in reverse parallel, and an equivalent circuit diagram can be referred to FIG. 1. Moreover, in the bottom view of FIG. 3A, the first connection portion 128A completely covers and contacts the first sub-second electrode 1061A (p-electrode) of the light-emitting diode 106 and does not completely cover the second sub-first electrode 1041B (n-electrode) of the voltage-stabilizing diode 104. The second connection portion 128B completely covers the second sub-second electrode 1061B (n-electrode) of the light-emitting diode 106 and does not completely cover the first sub-first electrode 1041A (p-electrode) of the voltage-stabilizing diode 104. The portions of the first sub-first electrode 1041A (p-electrode) and the second sub-first electrode 1041B (n-electrode) of the voltage-stabilizing diode 104 not covered by the metal connection layer are covered by the second insulating layer 124. In other words, the first sub-first electrode 1041A (p-electrode) (or the second sub-first electrode 1041B (n-electrode)) of the voltage-stabilizing diode 104 has a portion covered by the first connection portion 128A (or the second connection portion 128B) while the other portion is covered by the insulating layer. Furthermore, the glue layer 118 only covers two opposite sides of the first insulating layer 110 from a cross-sectional view.

According to the manufacturing method disclosed in an embodiment of the present disclosure, the voltage-stabilizing diode having the antistatic impact protection function is first disposed on the first temporary substrate by using the CSP (Chip Scale Package) manufacturing method, and then the light-emitting diode wafer is disposed next to the voltage-stabilizing diode. After dispensing, flattening, flipping, and screen printing, the voltage-stabilizing diode and the light-emitting diode are electrically connected. The present disclosure provides a method for manufacturing a light-emitting device without a substrate and having a simple process, and the light-emitting device prepared by this manufacturing method has a small size and has the same function as the CSP package structure.

Figure 4A:
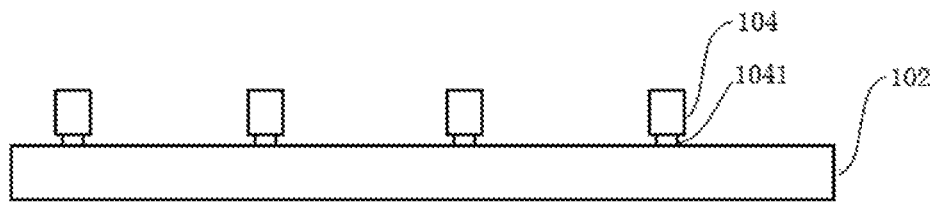
FIGS. 4A to 4H show the cross-sectional views of a manufacturing process of a light-emitting device in accordance with an embodiment of the present disclosure.
Figure 4B:
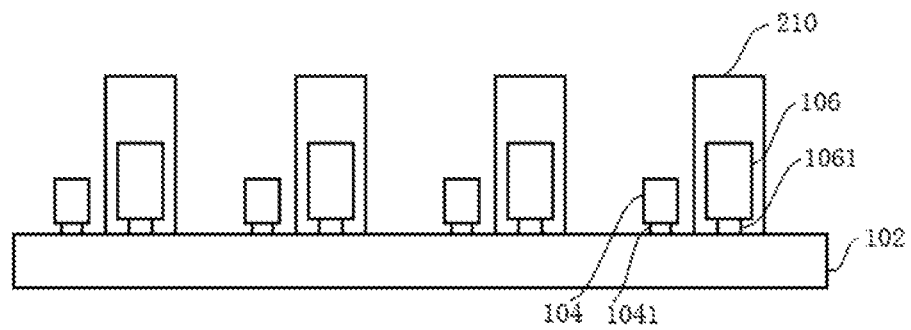

FIGS. 4A to 4H show a manufacturing process flow of a light-emitting device in accordance with an embodiment of the present disclosure. As shown in FIG. 4A and FIG. 4B, a first temporary carrier 102 is provided; a plurality of light-emitting units are disposed on the first temporary carrier 102, and each of the light-emitting units includes a voltage-stabilizing diode 104 and a light-emitting diode 106. The voltage-stabilizing diode 104 has a first electrode 1041 and the light-emitting diode 106 has a second electrode 1061. Referring to FIG. 5A, the voltage-stabilizing diode 104 and the light-emitting diode 106 respectively has two electrodes. Because of the view angle, only one electrode is shown in FIGS. 4A to 4H.

As shown in FIG. 4A, a plurality of voltage-stabilizing diodes 104 may be first disposed on the first temporary carrier 102 and the first electrode 1041 faces the first temporary carrier 102. In some embodiments, the voltage-stabilizing diode 104 may be a Zener diode or a TVS diode. In this embodiment, the voltage-stabilizing diode 104 is a Zener diode. In the present embodiment, the number of the light-emitting diodes 106 and the number of the voltage-stabilizing diodes 104 are both four. Similarly, a light-emitting diode 106 and a voltage-stabilizing diode 104 are regarded as one light-emitting unit. In other embodiments, a light-emitting unit may include two or more light-emitting diodes 106 and one voltage-stabilizing diode 104, may include one light-emitting diode 106 and two or more voltage-stabilizing diodes 104, or may include two or more light-emitting diodes 106 and two or more voltage-stabilizing diodes 104.

As shown in FIG. 4B, a plurality of light-transmitting layers 210 respectively covering the respective light-emitting diodes 106 is formed. Optionally, the phosphor particles are mixed into the light-transmitting layer. The light-transmitting layer may comprise silicone or epoxy. The light-transmitting layer 210 only covers the light-emitting diode 106 and does not cover the voltage-stabilizing diode 104. In an embodiment, the light-emitting diode 106 can be disposed on the first temporary carrier 102, and then the light-transmitting layer 210 can be selectively coated on the light-emitting diode 106 without being formed on the voltage-stabilizing diode 104. Alternatively, the light-emitting diode 106 that has been coated with the light-transmitting layer 210 is disposed on the first temporary carrier 102.

Figure 4C:
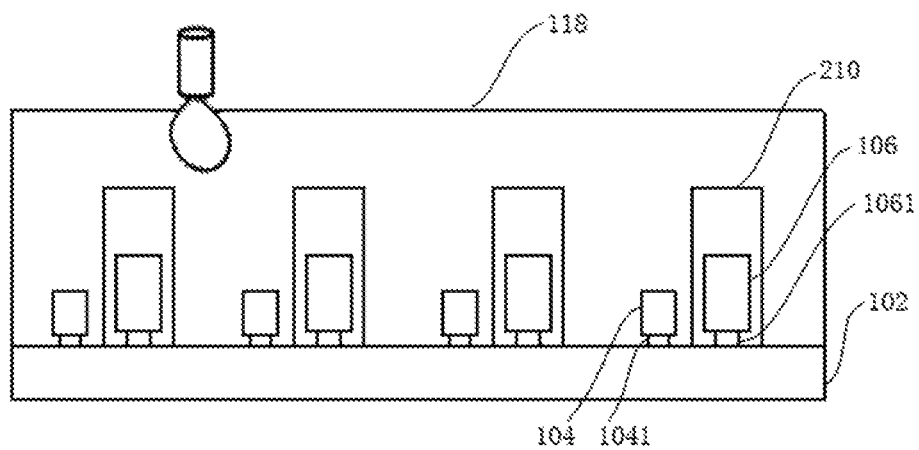
Figure 5A:
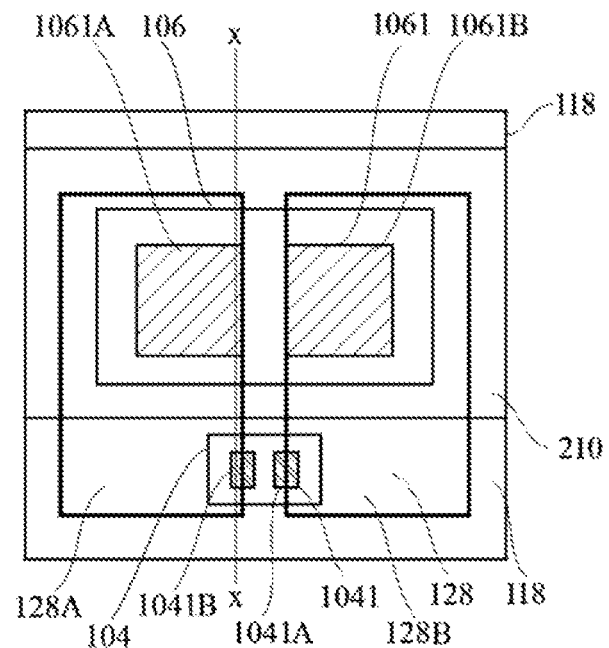
FIG. 5A is a bottom view of a light-emitting device in accordance with an embodiment of the present disclosure.

As shown in FIG. 4C, a glue layer 118 is formed on the first temporary carrier 102, and the glue layer 118 covers the plurality of voltage-stabilizing diodes 104 and the plurality of light-transmitting layers 210. The glue layer 118 covers the light-emitting diode 106 but does not directly contact the light-emitting diode 106. The glue layer 118 completely covers and directly contacts the voltage-stabilizing diode 104. The material of the glue layer 118 can be referred to the above-mentioned relevant paragraphs.

Figure 4D:
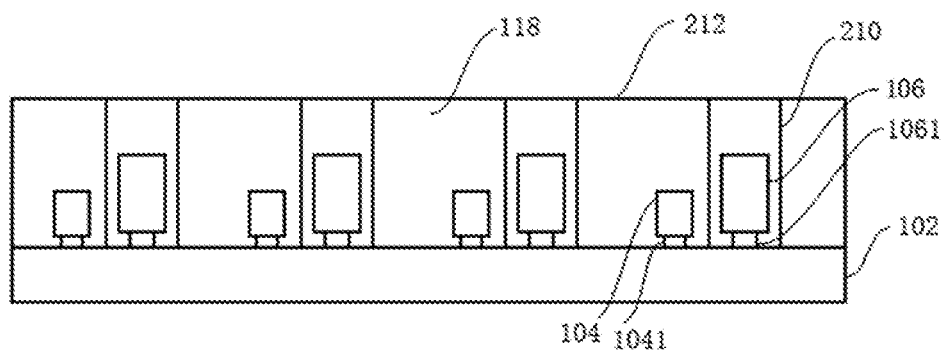
Figure 4E:
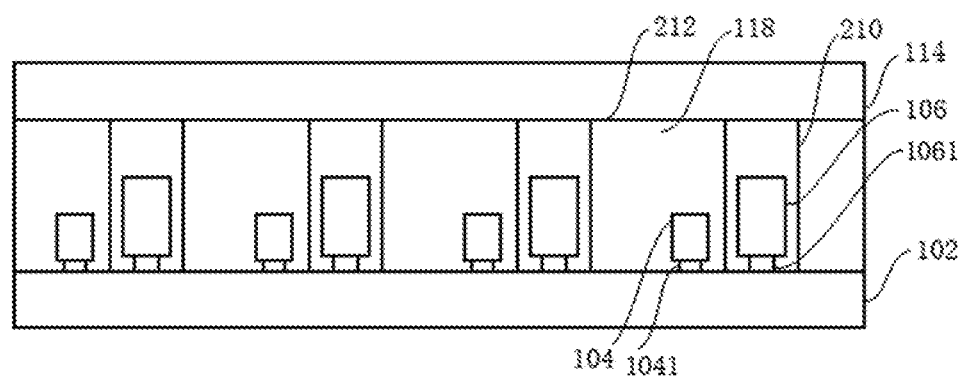

As shown in FIG. 4D, the glue layer 118 is physically removed, by grinding or polishing for example, to expose the light-transmitting layer 210 covering the light-emitting diode 106 and to form a surface 212 that will be bonded with a second temporary carrier 114 in a subsequent manufacturing process. As shown in FIG. 4E, the second temporary carrier 114 is bonded such that the plurality of light-emitting diodes 106 and the plurality of voltage-stabilizing diodes 104 are located between the first temporary carrier 102 and the second temporary carrier 114. That means the second temporary carrier 114 is boned to the surface 212 of the light-transmitting layer 210.

Figure 4F:
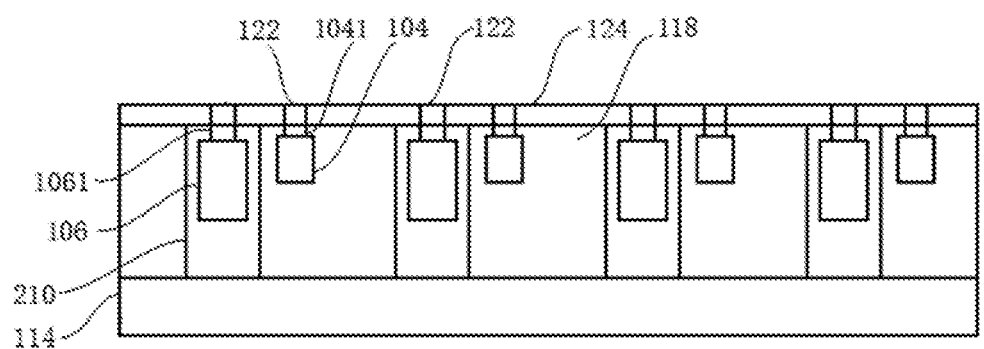
Figure 4G:
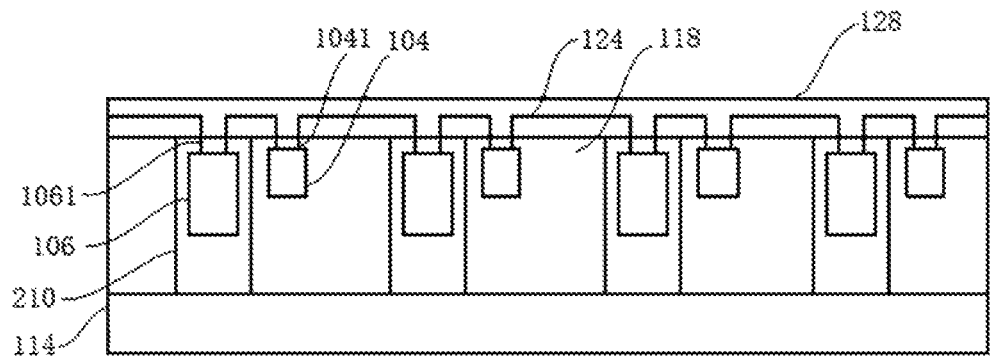

As shown in FIGS. 4F and 4G, after flipping the structure of FIG. 4E and removing the first temporary carrier 102, a metal connection layer 128 is formed on a side of the plurality of light-emitting units that is away from the second temporary carrier 114.

Specifically, as shown in FIG. 4F, after the first temporary carrier 102 is removed, the protective layers 122 respectively cover the first electrode 1041 of each of the voltage-stabilizing diodes 104 and the second electrode 1061 of each of the light emitting diodes 106. A second insulating layer 124 is filled between the protective layers. The second insulating layer 124 can be white glue. The protective layer 122 can be a photoresist.

As shown in FIG. 4G, after removing the protective layer 122, the first electrode 1041 and the second electrode 1061 are exposed. A metal connection layer 128 is formed on the first electrode 1041, the second electrode 1061 and the second insulating layer 124, wherein the metal connection layer 128 is connected to the first electrode 1041 of each of the voltage-stabilizing diodes 104 and the second electrode 1061 of each of the light-emitting diodes 106, and FIGS. 5A and 5B can be referred for detailed structure. The metal connection layer 128 can be formed by a printing or electroplating process. The material of the metal connection layer 128 comprises titanium, copper, nickel, silver, tin, gold, platinum or a combination thereof.

Figure 4H:
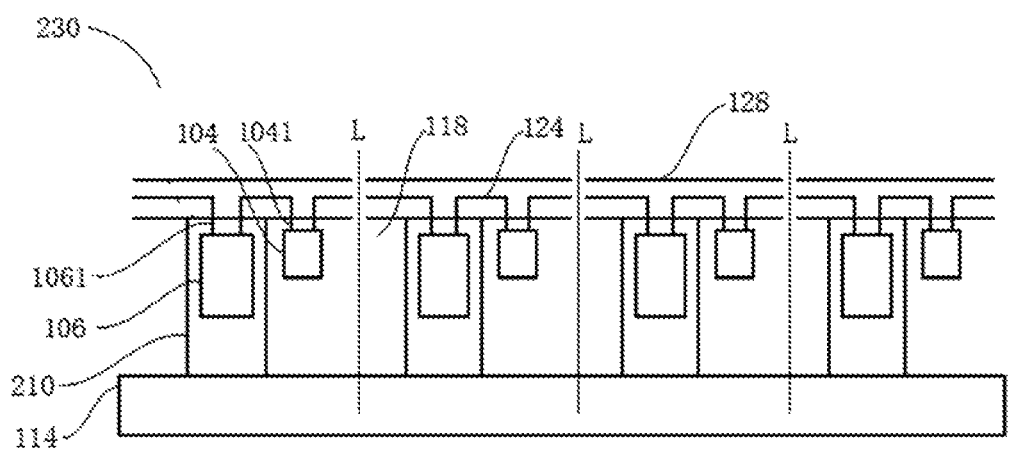

As shown in FIG. 4H, the metal connection layer 128, the second insulation layer 124, and the glue layer 118 are cut along the direction perpendicular to the second temporary substrate 114 (line L). Finally the second temporary carrier 114 is removed to form a plurality of light-emitting devices 230.

The light-emitting device 230 includes a light-emitting unit, a light-transmitting layer 210, a glue layer 118, a second insulating layer 124, and a metal connection layer 128. The voltage-stabilizing diode 104 and the light-emitting diode 106 in each of the light-emitting units are electrically connected to each other. The glue layer 118 surrounds the light-transmitting layer 210 and does not cover the top surface of the light-transmitting layer 210.

Figure 5B:
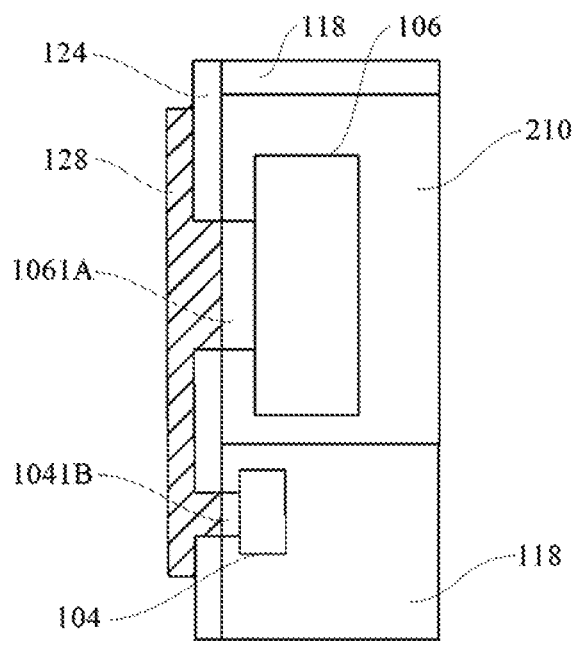
FIG. 5B is a cross-sectional view at X-X in FIG. 5A.

As shown in FIGS. 5A and 5B, a bottom view and a cross-sectional view of a light-emitting device 231 in an embodiment are exemplarily shown. FIG. 5B is a cross-sectional view of the X-X line in FIG. 5A. In order to clearly show the relative relationship between the components, each component is drawn in solid lines. However, in the actual product, only the second insulating layer 124 and the metal connection layer 128 can be viewed from the bottom view of the light-emitting device 231.

As shown in FIG. 5A, the light-emitting diode 106 has two second electrodes 1061 (a first sub-second electrode 1061A and a second sub-second electrode 1061B). The first sub-second electrode 1061A is a p-electrode (anode or positive electrode) and the second sub-second electrode 1061B is an n-electrode (cathode or negative electrode). The voltage-stabilizing diode 104 has two first electrodes 1041 (a first sub-first electrode 1041A and a second sub-first electrode 1041B). The first sub-first electrode 1041A is a p-electrode and the second sub-first electrode 1041B is an n-electrode. The metal connection layer includes a first connection portion 128A and a second connection portion 128B. The first connection portion 128A directly covers and contacts the first sub-second electrode 1061A (p-electrode) of the light-emitting diode 106 and the second sub-first electrode 1041B (n-electrode) of the voltage-stabilizing diode 104, whereby the first sub-second electrode 1061A (p-electrode) of the light-emitting diode 106 is connected to the second sub-first electrode 1041B (n-electrode) of the voltage-stabilizing diode 104. Similarly, the second connection portion 128B directly covers and contacts the second sub-second electrode 1061B (n-electrode) of the light-emitting diode 106 and the first sub-first electrode 1041A (p-electrode) of the voltage-stabilizing diode 104, whereby the second sub-second electrode 1061B (n-electrode) of the light-emitting diode 106 is connected to the first sub-first electrode 1041A (p-electrode) of the voltage-stabilizing diode 104. Therefore, the light-emitting diode 106 and the voltage-stabilizing diode 104 are connected in reverse parallel, and an equivalent circuit diagram can be referred to FIG. 1.

Moreover, in the bottom view of FIG. 5A, the first connection portion 128A completely covers the first sub-second electrode 1061A (p-electrode) of the light-emitting diode 106 and does not completely cover the second sub-first electrode 1041B (n-electrode) of the voltage-stabilizing diode 104. The second connection portion 128B completely covers the second sub-second electrode 1061B (n-electrode) of the light-emitting diode 106 and does not completely cover the first sub-first electrode 1041A (p-electrode) of the voltage-stabilizing diode 104. The portions of the first sub-first electrode 1041A (p-electrode) and the second sub-first electrode 1041B (n-electrode) of the voltage-stabilizing diode 104 not covered by the metal connection layer are covered by the second insulating layer 124. In other words, the first sub-first electrode 1041A (p-electrode) (or the second sub-first electrode 1041B (n-electrode)) of the voltage-stabilizing diode 104 has a portion covered by the first connection portion 128A (or the second connection portion 128B) while the other portion is covered by the second insulating layer 124.

According to the manufacturing method disclosed in an embodiment of the present disclosure, a voltage-stabilizing diode (for example, a Zener diode) is disposed in highly reflective material (such as a glue layer) containing reflective particles to reduce the light absorbed by the voltage-stabilizing diode. Therefore the light-emitting efficiency of the light-emitting device can be enhanced.

FIGS. 6A to 6H show a manufacturing process flow of a light-emitting device 330 in accordance with an embodiment of the present disclosure.

Figure 6A:
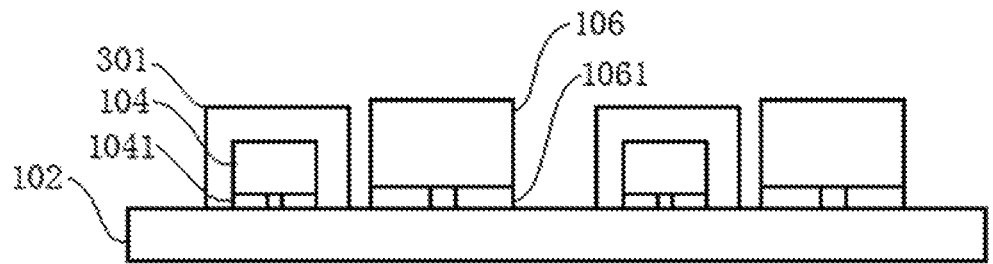
FIGS. 6A to 6I show the cross-sectional views of a manufacturing process of a light-emitting device in accordance with an embodiment of the present disclosure.

As shown in FIG. 6A, a first temporary carrier 102 is provided; a plurality of light-emitting units are disposed on the first temporary carrier 102, and each of the light-emitting units includes a voltage-stabilizing diode 104 and a light-emitting diode 106. In some embodiments, the voltage-stabilizing diode 104 may be a Zener diode or a TVS diode. In the present embodiment, two of the light-emitting diodes 106 and two of the voltage-stabilizing diodes 104 are disclosed in the description. Similarly, a light-emitting diode 106 and a voltage-stabilizing diode 104 are regarded as one light-emitting unit. In other embodiments, a light-emitting unit may include two or more light-emitting diodes 106 and one voltage-stabilizing diode 104, may include one light-emitting diode 106 and two or more voltage-stabilizing diodes 104, or may include two or more light-emitting diodes 106 and two or more voltage-stabilizing diodes 104.

As shown in FIG. 6A, the voltage-stabilizing diode 104 has two first electrodes 1041 and the light-emitting diode 106 has two second electrodes 1061. The first electrode 1041 and the second electrode 1061 face the first temporary carrier 102. The voltage-stabilizing diode 104 is first coated by the glue layer 301 and then placed on the first temporary carrier 102. The glue layer 301 is formed by mixing reflective particles into the base material. The base material may be an insulating material and can be silicone-based or epoxy-based; the reflective particles may include titanium dioxide, hafnium oxide, barium sulfate, or aluminum oxide.

Figure 6B:
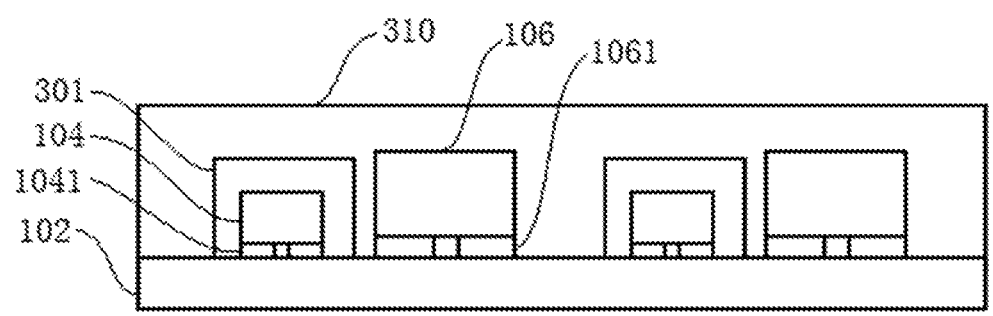

As shown in FIG. 6B, a light-transmitting layer 310 is formed to cover the light-emitting diode 106 and the glue layer 301. The phosphor powder particles may be selectively mixed into the light-transmitting layer 310. The light-transmitting layer 310 may include silicone or epoxy. The light-transmitting layer 310 may be formed by spraying or molding.

Figure 6C:
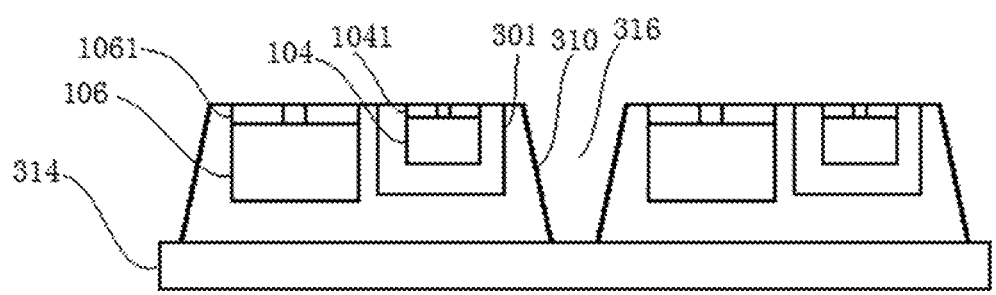

As shown in FIG. 6C, after the second temporary carrier 314 is bonded to the light-transmitting layer 310, the structure as shown in FIG. 6B is flipped and the first temporary carrier 102 is removed. Next, the light-transmitting layer 310 is cut to form trenches 316, wherein the trenches 316 have sloped sidewalls.

Figure 6D:
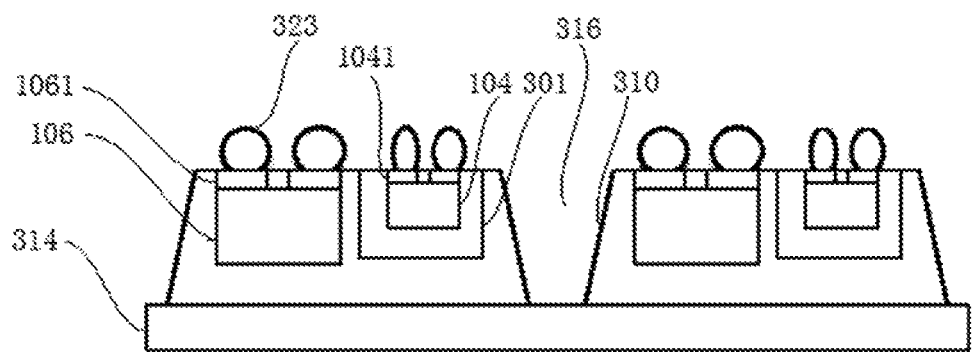

As shown in FIG. 6D, metal bumps 323 are formed on a side of the plurality of light-emitting units away from the second temporary carrier 314. Each of the metal bumps 323 is respectively located on the second electrode 1061 of the light-emitting diode and the first electrode 1041 of the voltage-stabilizing diode. In an embodiment, the metal bump 323 is a lead-free solder comprising one material selected from tin, copper, silver, antimony, indium, zinc, and antimony.

Figure 6E:
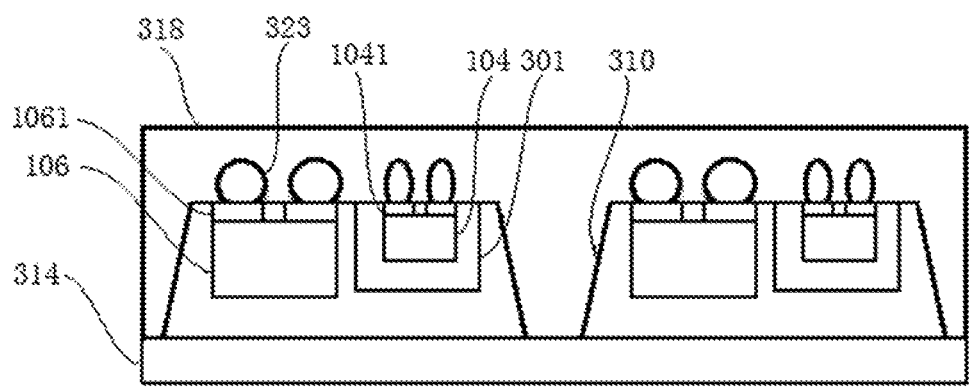

As shown in FIG. 6E, a third insulating layer 318 covering the light-emitting unit and the metal bump 323 is formed. In this embodiment, the third insulating layer 318 is a glue layer.

Figure 6F:
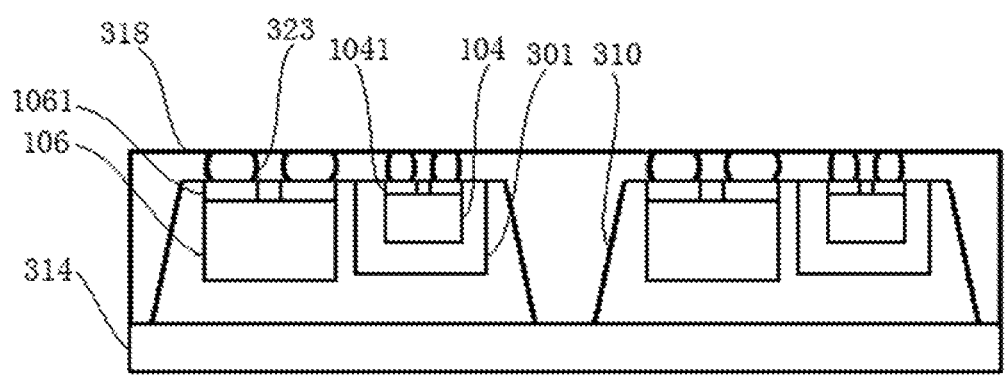

As shown in FIG. 6F, the third insulating layer 318 is polished to expose the metal bumps 323.

Figure 6G:
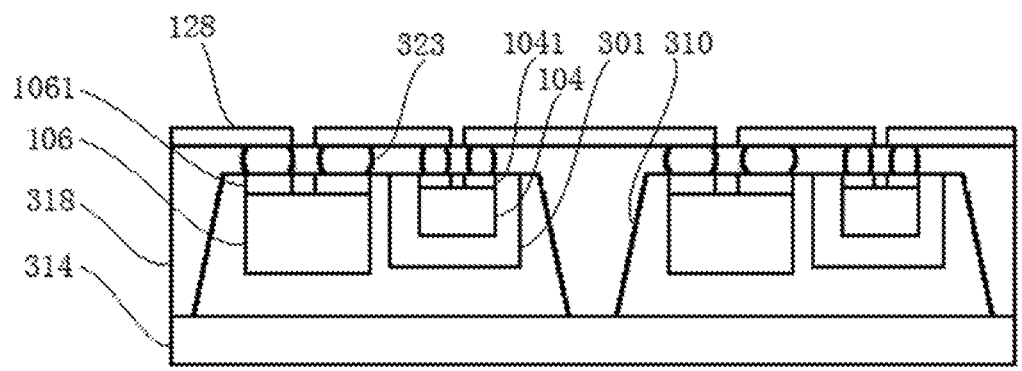

As shown in FIG. 6G, a metal connection layer 128 connected to the metal bumps 323 is formed. The metal connection layer 128 is connected to the first electrode 1041 of the voltage-stabilizing diode 104 and the second electrode 1061 of the light-emitting diode 106. The metal connection layer 128 can be formed by a printing or electroplating process. The material of the metal connection layer 128 comprises titanium, copper, nickel, silver, tin, gold, platinum or a combination thereof.

Figure 6H:
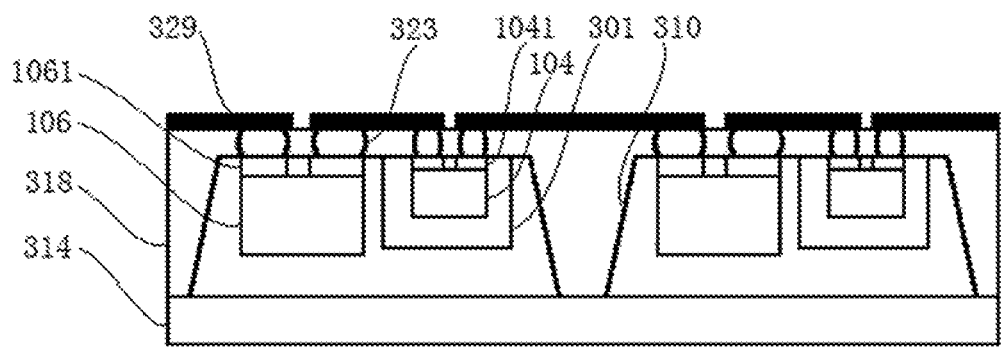

As shown in FIG. 6H, the metal connection layer may also be selectively formed by coating the copper paste 329.

Figure 6I:
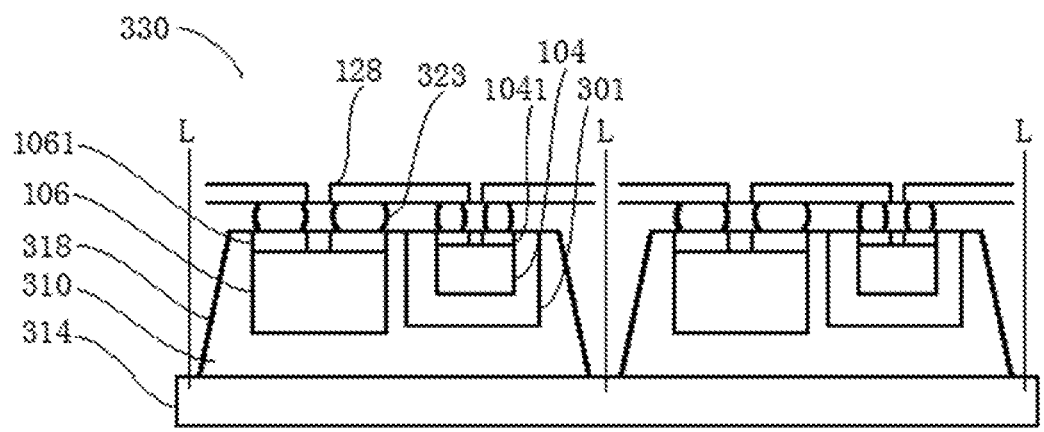

As shown in FIG. 6I, the metal connection layer 128 and the third insulating layer 318 are cut between the respective adjacent light-emitting units, that is, cut along a straight line L to form a plurality of light-emitting devices 330. The light-emitting device 330 includes a light-emitting unit, glue layer 301, light-transmitting layer 310, third insulating layer 318, metal bump 323 and metal connection layer 128. The voltage-stabilizing diode 104 and the light-emitting diode 106 in each of the light-emitting units are electrically connected to each other. Moreover, the light-transmitting layer 310 completely covers the glue layer 301. The third insulating layer 318 surrounds the light-transmitting layer 310 and the metal bumps 323.

Figure 6J:
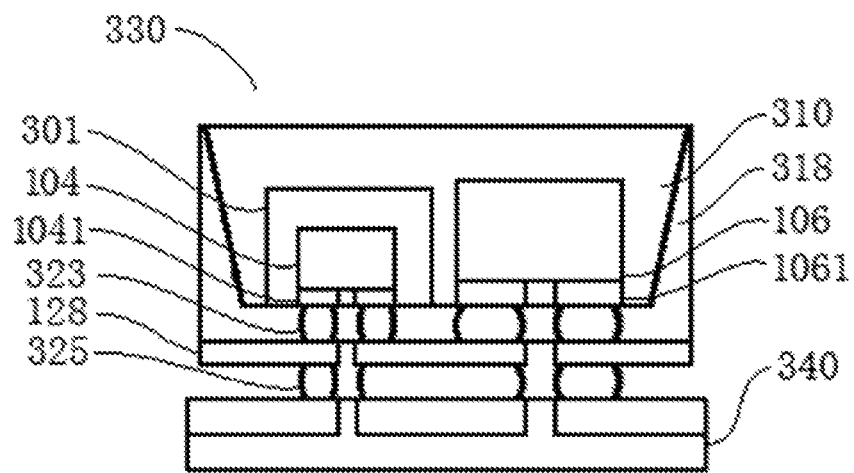
FIG. 6J is a schematic diagram showing the connection between the light-emitting device and an apparatus in accordance with an embodiment of the present disclosure.

As shown in FIG. 6J, the light-emitting device 330 connects the light-emitting unit to the apparatus 340 through solder 325. In an embodiment, the apparatus 340 may be a substrate having an electrical connection circuit, such as a PCB board, or a metal circuit formed on an insulating carrier board.

According to the manufacturing method disclosed in an embodiment of the present disclosure, the voltage-stabilizing diode (for example, a Zener diode) is first coated with a highly reflective material, and then being packaged with the light-emitting diode subsequently. Comparing with a second insulating layer 218 formed by a printing process disclosed in FIG. 4F, in this embodiment, the metal bumps 323 and the third insulating layer 318 are first formed and then polished to expose the metal bumps 323, thereby reducing the yield loss caused by the misalignment in the printing process.

Figure 7:
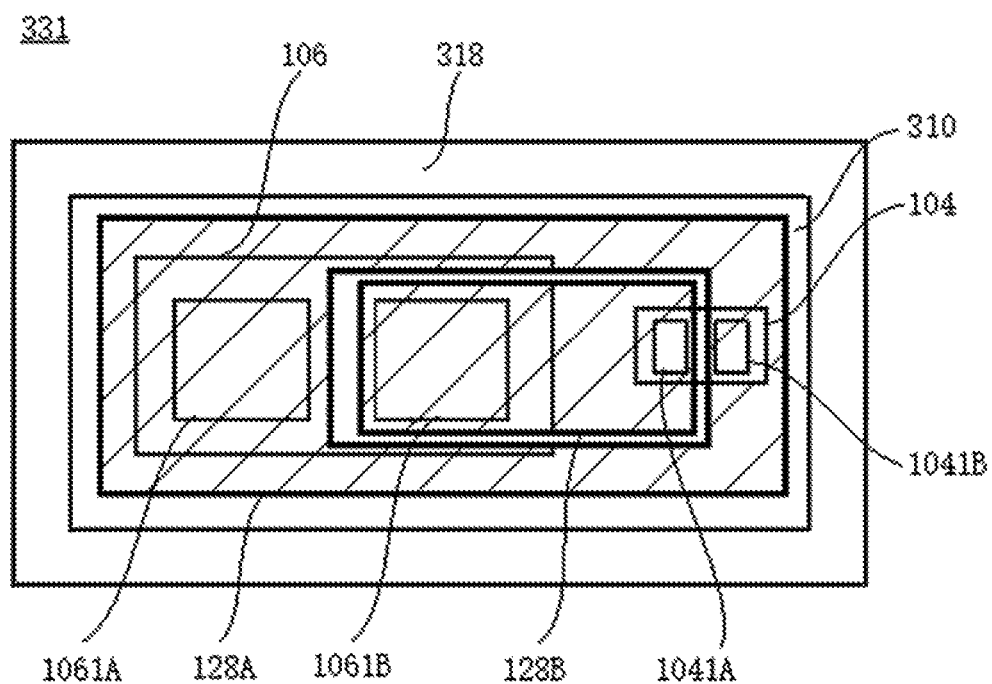
FIG. 7 is a bottom view of a light-emitting device in accordance with an embodiment of the present disclosure.

As shown in FIG. 7, a bottom view of the light-emitting device 331 in an embodiment is exemplarily shown.

As shown in FIG. 7, the light-emitting diode 106 has two second electrodes 1061 (a first sub-second electrode 1061A and a second sub-second electrode 1061B). The first sub-second electrode 1061A is a p-electrode (anode or positive electrode) and the second sub-second electrode 1061B is an n-electrode (cathode or negative electrode). The voltage-stabilizing diode 104 has two first electrodes 1041 (a first sub-first electrode 1041A and a second sub-first electrode 1041B). The first sub-first electrode 1041A is a p-electrode and the second sub-first electrode 1041B is an n-electrode. The metal connection layer includes a first connection portion 128A and a second connection portion 128B. The first connection portion 128A directly covers and contacts the first sub-second electrode 1061A (p-electrode) of the light-emitting diode 106 and the second sub-first electrode 1041B (n-electrode) of the voltage-stabilizing diode 104, whereby the first sub-second electrode 1061A (p-electrode) of the light-emitting diode 106 is connected to the second sub-first electrode 1041B (n-electrode) of the voltage-stabilizing diode 104. Similarly, the second connection portion 128B directly covers and contacts the second sub-second electrode 1061B (n-electrode) of the light-emitting diode 106 and the first sub-first electrode 1041A (p-electrode) of the voltage-stabilizing diode 104, whereby the second sub-second electrode 1061B (n-electrode) of the light-emitting diode 106 is connected to the first sub-first electrode 1041A (p-electrode) of the voltage-stabilizing diode 104. Therefore, the light-emitting diode 106 and the voltage-stabilizing diode 104 are connected in reverse parallel, and an equivalent circuit diagram can be referred to FIG. 1.

Moreover, in the bottom view of FIG. 7, the first connection portion 128A completely covers the first sub-second electrode 1061A (p-electrode) of the light-emitting diode 106 and the second sub-first electrode 1041B (n-electrode) of the voltage-stabilizing diode 104. The second connection portion 128B completely covers the second sub-second electrode 1061B (n-electrode) of the light-emitting diode 106 and the first sub-first electrode 1041A (p-electrode) of the voltage-stabilizing diode 104. The first connection portion 128A surrounds the second connection portion 128B. In addition, the third insulating layer 318 surrounds the periphery of the light-transmitting layer 310.

Figure 8:
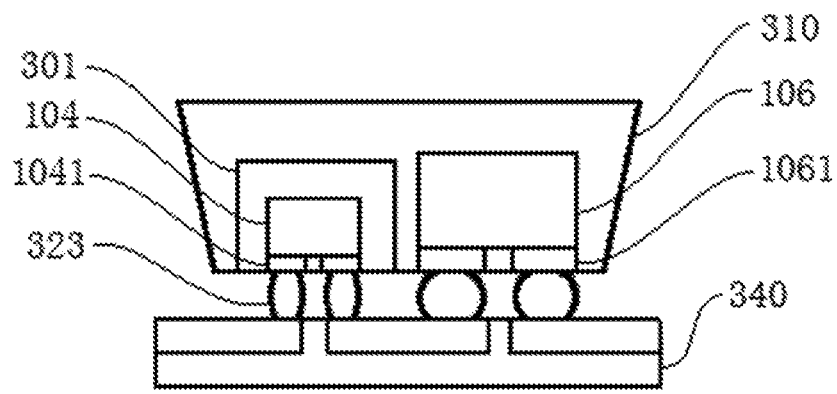
FIG. 8 is a schematic diagram showing the connection between the structure of FIG. 6D and the apparatus.

As shown in FIG. 8, after removing the second temporary carrier 314 in the structure of FIG. 6D, the light-emitting unit is connected to the apparatus 340 through the metal bumps 323. The apparatus 340 can be a substrate having an electrical connection circuit, that is, the light-emitting unit can be directly bonded and fixed on the substrate through the metal bumps 323, and only a flux (not shown) needs to be coated between the substrate and the light-emitting unit without further additional coating solder.

Figure 9:
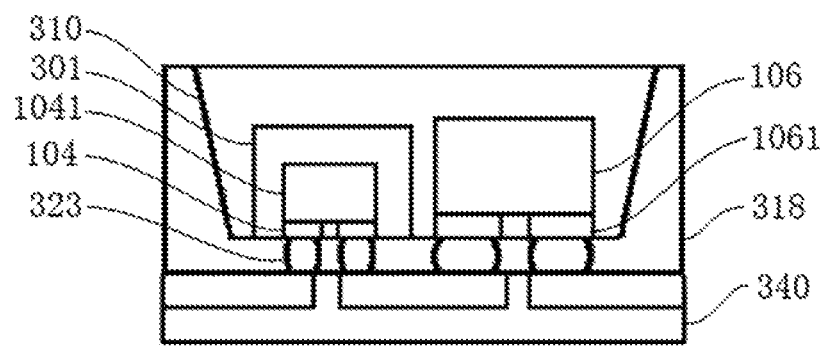
FIG. 9 is a schematic diagram showing the connection between the structure of FIG. 6F and the apparatus.

As shown in FIG. 9, after removing the second temporary carrier 314 in the structure of FIG. 6F, the light-emitting unit is connected to the apparatus 340 through the metal bumps 323. Similar to FIG. 8, the light-emitting unit can be directly bonded and fixed on the substrate through the metal bumps 323, and only a flux (not shown) needs to be coated between the substrate and the light-emitting unit without further additional coating solder.

Table 1 and Table 2 respectively show the photoelectric data of the light-emitting device 130 and the light-emitting device 230 in accordance with an embodiment of the present disclosure (five samples for each light-emitting device are tested). It can be seen from Table 1 and Table 2 that the average value of the luminous intensity of the light-emitting device 230 is about 6.5% higher than the average value of the luminous intensity of the light-emitting device 130.

TABLE 1

| NO. | Luminous flux [lm] | Radiant flux [W] | Dominant wavelength [nm] | Peak wavelength [nm] | FWHM [nm] | Voltage [V] | Current [A] | Power consumption [W] | Luminous efficacy [lm/W] |
|---|---|---|---|---|---|---|---|---|---|
| 1 | 6.8072 | 0.2584 | 450.3 | 444.8158 | 15.9 | 2.8631 | 0.1604 | 0.4592 | 14.8 |
| 2 | 7.1461 | 0.2565 | 451.3 | 446.6667 | 16.3 | 2.8491 | 0.1604 | 0.4569 | 15.6 |
| 3 | 7.108 | 0.2548 | 451.3 | 446.6667 | 15.5 | 2.8507 | 0.1604 | 0.4572 | 15.5 |
| 4 | 7.6123 | 0.258 | 452.3 | 447.0367 | 15.9 | 2.8516 | 0.1604 | 0.4573 | 16.6 |
| 5 | 7.1145 | 0.2586 | 451 | 446.2966 | 15.9 | 2.8574 | 0.1604 | 0.4583 | 15.5 |
| AVG. | | 0.25726 | | | | | | | |

TABLE 2

| NO. | Luminous flux [lm] | Radiant flux [W] | Dominant wavelength [nm] | Peak wavelength [nm] | FWHM [nm] | Voltage [V] | Current [A] | Power consumption [W] | Luminous efficacy [lm/W] |
|---|---|---|---|---|---|---|---|---|---|
| 1 | 7.6161 | 0.2742 | 451.2 | 446.2966 | 15.9 | 2.8436 | 0.1604 | 0.456 | 16.7 |
| 2 | 7.7354 | 0.2741 | 451.4 | 446.6667 | 15.9 | 2.844 | 0.1604 | 0.4561 | 17 |
| 3 | 7.469 | 0.2741 | 450.8 | 445.5562 | 15.9 | 2.8457 | 0.1603 | 0.4563 | 16.4 |
| 4 | 7.5125 | 0.2742 | 451 | 445.5562 | 15.9 | 2.8444 | 0.1603 | 0.456 | 16.5 |
| 5 | 7.4547 | 0.2735 | 450.8 | 445.5562 | 15.9 | 2.8461 | 0.1603 | 0.4563 | 16.4 |
| AVG. | | 0.27402 | | | | | | | |

When the light-emitting device without the voltage-stabilizing diode and the light-emitting device 230 are subjected to a Human Body Mode Electro Static Discharge test, it is understood that the voltage drop ratio of the light-emitting device 230 is lower. Therefore, the light-emitting device 230 has a high anti-static impact capability.

The above are only the preferred embodiments of the present disclosure, and are not intended to limit the present disclosure. Any modifications, equivalents, improvements, etc., which are included in the spirit and scope of the present disclosure, should be included in the scope of the present disclosure.

What is claimed is:

1. A light-emitting device, comprising:
a light-emitting unit including a non-light-emitting element and a light-emitting diode, wherein the light emitting diode has a first electrode and a second electrode and the non-light-emitting element has a third electrode and a fourth electrode;
a reflective layer covering the non-light-emitting element;
a light-transmitting layer covering the reflective layer and the light-emitting diode; and
a metal connection layer electrically connected to the non-light-emitting element and the light-emitting diode, wherein the metal connection layer has a first connection portion covering at least part of the first electrode and at least part of the fourth electrode and a second connection portion covering at least part of the second electrode and at least part of the third electrode.

2. The light-emitting device of claim 1, further comprising an insulating layer surrounding the light-transmitting layer.

3. The light-emitting device of claim 1, wherein the first connection portion surrounds the second connection portion.

4. The light-emitting device of claim 1, further comprising metal bumps formed on the first electrode, the second electrode, the third electrode and the fourth electrode.

5. The light-emitting device of claim 1, further comprising an apparatus, the light-emitting unit connected with the apparatus through the metal connection layer.

6. The light-emitting device of claim 4, further comprising an insulating layer surrounding the metal bumps.

7. The light-emitting device of claim 1, further comprising metal bumps formed on the first electrode and the second electrode.

8. The light-emitting device of claim 7, further comprising an apparatus that is connected to the light-emitting unit by the metal bumps.

9. The light-emitting device of claim 8, further comprising solders connecting the light-emitting unit and the apparatus.

10. The light-emitting device of claim 9, further comprising metal connection layers located between the metal bumps and the solders.

11. The light-emitting device of claim 8, wherein the apparatus is a substrate having an electrical connection circuit or an insulating carrier board having a metal circuit.

12. The light-emitting device of claim 7, further comprising an insulating layer surrounding the light-transmitting layer and the metal bumps.

13. The light-emitting device of claim 1, wherein the non-light-emitting element is a voltage-stabilizing diode.

14. The light-emitting device of claim 13, wherein the first electrode is a p-electrode of the light-emitting diode, the second electrode is a n-electrode of the light-emitting diode, the third electrode is a p-electrode of the voltage-stabilizing diode and the fourth electrode is a n-electrode of the voltage-stabilizing diode.

15. The light-emitting device of claim 1, wherein the reflective layer is a glue layer mixing with titanium dioxide, hafnium oxide, barium sulfate, or aluminum oxide particles.

16. The light-emitting device of claim 2, wherein the insulating layer is a glue layer.

17. The light-emitting device of claim 1, further comprising phosphor powder particles mixed into the light-transmitting layer.

18. The light-emitting device of claim 17, wherein the light-transmitting layer is silicone or epoxy.

19. The light-emitting device of claim 1, wherein the light-transmitting layer comprises sloped sides.

* * * * *